United States Patent
Hu

[19]

[11] Patent Number: 6,055,929
[45] Date of Patent: *May 2, 2000

[54] MAGNETRON

[75] Inventor: Ing-Feng Hu, Midland, Mich.

[73] Assignee: The Dow Chemical Company, Midland, Mich.

[*] Notice: This patent is subject to a terminal disclaimer.

[21] Appl. No.: 09/227,661

[22] Filed: Jan. 8, 1999

Related U.S. Application Data

[62] Division of application No. 08/963,153, Sep. 24, 1997, Pat. No. 5,900,284.

[51] Int. Cl.[7] .................................................. C23C 16/00
[52] U.S. Cl. ............................. 118/723 E; 118/723 MA; 118/723 R; 156/345; 315/111.41; 427/489; 427/58; 427/127; 427/255.3; 427/255.6; 427/471; 427/474; 427/547; 427/578; 427/598
[58] Field of Search ........................ 118/723 R, 723 E, 118/723 ER, 712 MR, 723 MA; 315/111.21, 111.41; 156/345; 427/58, 127, 255.3, 255.6, 471, 474, 489, 547, 578, 598

[56] References Cited

U.S. PATENT DOCUMENTS

| | | | |
|---|---|---|---|
| 2,146,025 | 2/1939 | Penning | 250/27.5 |
| 4,013,532 | 3/1977 | Cormia et al. | 204/192 |
| 4,260,647 | 4/1981 | Wang et al. | 427/40 |
| 4,282,083 | 8/1981 | Kertesz et al. | 204/298 |
| 4,336,278 | 6/1982 | Pertzsch et al. | 427/47 |
| 4,496,450 | 1/1985 | Hitotsuyanagi et al. | 204/192 |
| 4,818,358 | 4/1989 | Hubert et al. | 204/298 |
| 4,863,756 | 9/1989 | Hartig et al. | 427/39 |
| 4,886,565 | 12/1989 | Koshiba et al. | 156/345 |
| 5,160,398 | 11/1992 | Yanagida | 156/345 |
| 5,178,743 | 1/1993 | Kumar | 204/298.21 |
| 5,298,587 | 3/1994 | Hu et al. | 528/10 |
| 5,320,875 | 6/1994 | Hu et al. | 427/493 |
| 5,364,666 | 11/1994 | Williams et al. | 427/579 |
| 5,433,786 | 7/1995 | Hu et al. | 118/723 |
| 5,494,712 | 2/1996 | Hu et al. | 427/489 |
| 5,605,576 | 2/1997 | Sasaki et al. | 118/723 E |
| 5,900,284 | 5/1999 | Hu | 427/489 |

FOREIGN PATENT DOCUMENTS

| | | |
|---|---|---|
| 0 297 235 | 4/1988 | European Pat. Off. . |
| 60-156547 | 8/1985 | Japan . |
| 63-319956 | 6/1990 | Japan . |

OTHER PUBLICATIONS

Plasma Deposition, Treatment and Etching of Polymers, "Plasma Polymer–Metal Composite Films," H. Biederman, et al., pp. 269–320, 1990.

Handbook of Plasma Processing Technology, "Magnetron Plasma Deposition Processes," S. M. Rossnagel, pp. 160–182.

Solid State Technology/Apr. 1987, "Magnetically Enhanced Plasma Deposition and Etching," M. F. Leahy, et al., pp. 99–104.

The First Annual International Conference of Plasma Chemistry and Technology, "Plasma Polymerization: Thin Effects of Frequency and of the Planar Magnetron Geometry," N. Morosoft, pp. 41–53 (No month or year).

Thin Solid Films, "Plasma Polymerization of Tetramethyldisiloxane by a Magnetron Glow Discharge," A. K. Sharma, et al., pp. 171–184, 1983.

J. Vac. Sci. Technol., vol. 15, No. 6, "Plasma Polymerization of Ethylene by Magnetron Discharge," N. Morosoff, et al., pp. 1815–1822, Nov./Dec. 1978.

*Primary Examiner*—Thi Dang
*Assistant Examiner*—Luz Alejandro
*Attorney, Agent, or Firm*—Stanley K. Hill

[57] ABSTRACT

Methods and devices for producing plasmas of more uniform density and greater height than plasmas generated by previously known magnetron-type plasma-generating devices. The present invention utilizes electrodes containing multiple magnets positioned such that like magnetic poles of the magnets are all facing in substantially the same direction.

12 Claims, 3 Drawing Sheets

MAGNETRON

This application is a Divisional of prior application Ser. No. 08/936,153, filed Sep. 24, 1997, now U.S. Pat. No. 5,900,284.

This invention relates to plasma-generating devices. More specifically, this invention relates to magnetron-type plasma-generating devices (i.e., magnetrons) capable of sustaining plasmas of more uniform density than plasmas generated by previously known magnetron-type plasma-generating devices.

Magnetrons have been known in the art for a long time and have been used, for example, in etching, surface modification, and plasma-enhanced chemical vapor deposition ("PECVD"). PECVD devices are also known in the art. Examples of PECVD devices can be found in U.S. Pat. Nos. 5,298,587; 5,320,875; 5,433,786; and 5,494,712, the teachings of which are herein incorporated by reference.

As explained in Chapter 6 of the *Handbook of Plasma Processing Technology*, Noyes Publications 1990, magnetrons are a class of cold cathode discharge devices generally used in a diode mode. A plasma is initiated between the cathode and the anode at pressures in the mTorr range by the application of a high voltage, which can be either dc or rf. The plasma is sustained by the ionization caused by secondary electrons emitted from the cathode due to ion bombardment which are accelerated into the plasma across the cathode sheath. What differentiates a magnetron cathode from a conventional diode cathode is the presence of a magnetic field. The magnetic field in the magnetron is oriented such that a component of the magnetic field is parallel to the cathode surface. The local polarity of the magnetic field is oriented such that the E×B drift paths of the emitted secondary electrons form a closed loop. Due to the increased confinement of the secondary electrons in this E×B drift loop compared to a dc or rf diode device, the plasma density is much higher, often by an order of magnitude or more, than a conventional rf or dc diode plasma. The result of the high plasma density and its proximity to the cathode is a high current, relatively low voltage discharge.

It is also known in the art, that when using a magnetron in a process to coat a substrate such as in a PECVD process, it is difficult to obtain a coating of uniform thickness and quality. One aspect of quality is uniform chemical composition of the coating both in thickness and width directions. To get a coating of uniform thickness and quality the substrate must be moved relative to the electrodes. This is especially true for large substrates. Moving the substrates relative to the electrodes causes a decrease in throughput.

SUMMARY OF THE INVENTION

The present invention allows for more uniform (thickness and quality) coatings to be obtained more easily than do devices of the prior art, especially on large substrates. In one aspect, the present invention is an electrode to containing multiple magnets positioned such that like magnetic poles of said magnets are all facing in substantially the same direction. Each magnet produces a magnetic field between the opposite magnetic poles on the same magnet. Each magnetic field has a component parallel to the surface of the electrode. Electrodes of the present invention have a higher number of closed loop E×B drift paths per number of magnets than electrodes of the prior art. Electrodes of the present invention are capable of producing a more uniform plasma across the surface of an electrode. In addition, electrodes of the present invention produce plasmas of greater height than electrodes of the prior art. According to the present invention, large numbers of magnets (i.e., two or more) can be aligned in various configurations so as to create large electrodes capable of producing large, more uniform, plasmas.

In another aspect, the present invention is an improved plasma-generating device utilizing electrodes of the present invention. In another aspect, the present invention is an improved method of forming a plasma and an improved method for coating various substrates. For example, electrodes of the present invention can be advantageously utilized with the teachings of U.S. Pat. Nos. 5,298,587; 5,320,875; 5,433,786; and 5,494,712 to produce improved PECVD devices and methods of forming plasmas and coatings onto various substrates.

In one embodiment of the present invention, the electrode is a planar electrode comprising two or more magnets positioned such that like poles of said magnets are in a single geometric plane parallel to the geometric plane of the planar electrode and the polarity of said magnets is perpendicular to the geometric plane of the planar electrode, each magnet producing a magnetic field having a component parallel to the geometric plane of the electrode.

DETAILED DESCRIPTION OF THE INVENTION

Figure 1:
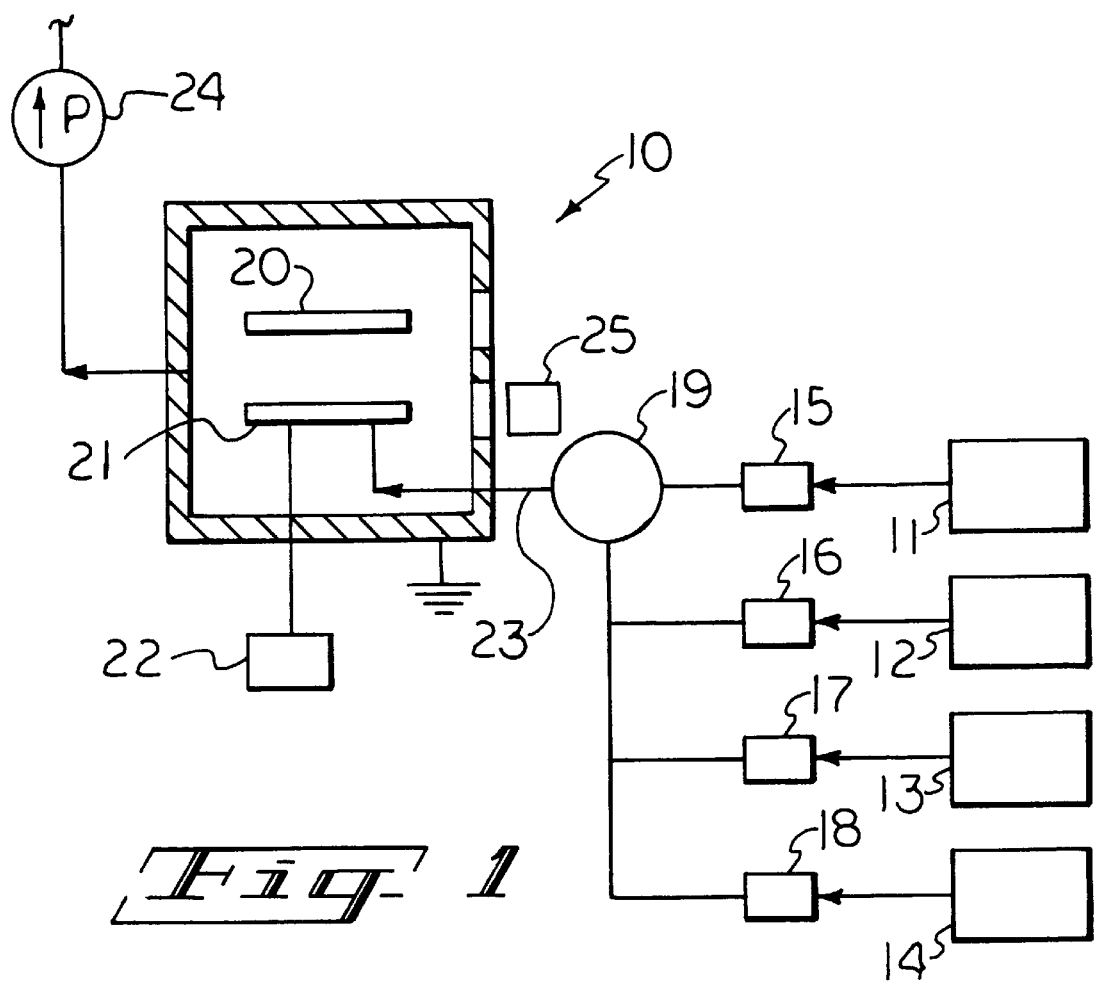
FIG. 1 is a schematic view of a plasma apparatus of the present invention.

FIG. 1 illustrates an apparatus of the present invention in which an electrode of the present invention can be effectively utilized. The apparatus comprises a reactor vessel 10 into which gaseous reactants can be introduced from sources 11, 12, 13, and 14 through mass flow controllers 15, 16, 17, and 18. If desired, the different gases and vapors from the indicated sources can be mixed in a mixer 19 prior to introducing them into the reactor vessel.

Disposed in the reactor vessel 10 are a pair of opposed electrodes 20 and 21. The substrate to be treated is placed between the electrodes 20 and 21. Electrode 21, the cathode, is connected to a variable frequency power source 22. Electrode 20 can be advantageously grounded through the reactor vessel walls. Gaseous reactants are dispersed into the interior of the vessel from gas supply line 23. The reactor vessel 10 can be advantageously connected to a vacuum system 24 for evacuating the vessel 10. Optionally, the reactor vessel could be equipped with monitoring devices such as an optical monitor 25 to determine the thickness of the coating.

Preferably, both electrodes 20 and 21 are embodiments of the present invention. However, it is not necessary for both electrodes to be embodiments of the present invention. If only one electrode is an embodiment of the present invention, then preferably electrode 21, the cathode, is an embodiment of the present invention.

In operation, the reactor vessel 10 is first evacuated by means of the vacuum pump 24 prior to introducing gaseous reactants (e.g., organosilicone and oxygen) and inert gases, if any, to the vessel at a predetermined flow rate through supply line 23. When the flow rate of the gases becomes constant the variable frequency power 22 is turned on to a predetermined value to generate a plasma which causes the reactants to form a film on the substrate.

Figure 2:
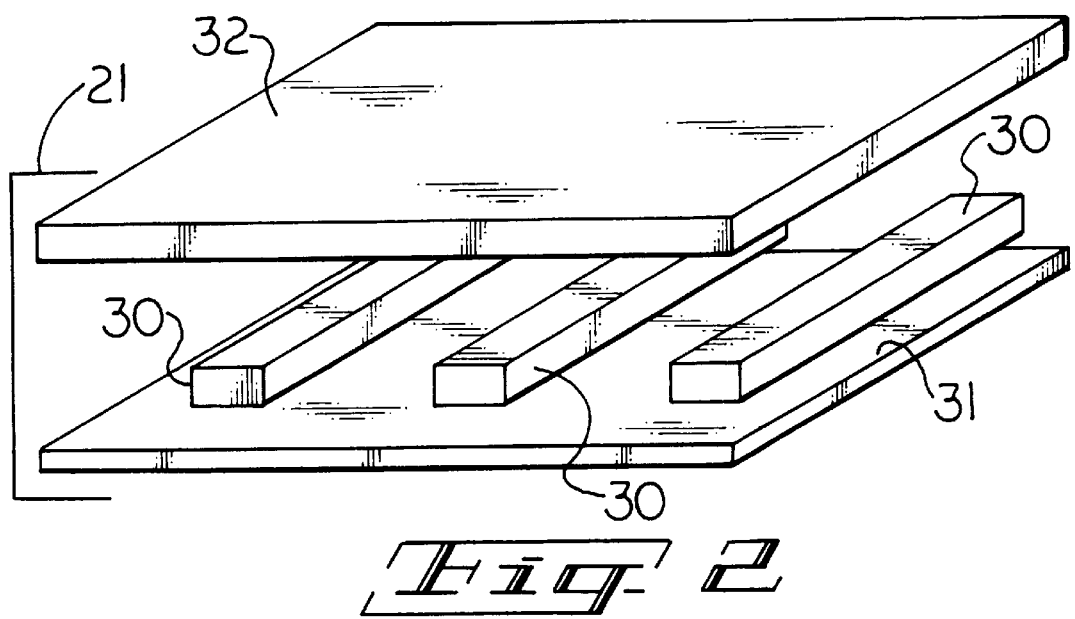
FIG. 2 is an exploded view of an electrode of the present invention.

FIG. 2 depicts an exploded view of an electrode 21 of the present invention. In FIG. 2, bar magnets 30 are placed on a bottom plate 32. The magnets 30 can be advantageously adhered to the bottom plate 32. A header plate 31 is place on the magnets 30. The header plate 31 may optionally have holes or slits in it to allow the gaseous reactants and inert gases, if present, to pass through it as taught in U.S. Pat. No. 5,433,786.

Figure 3:
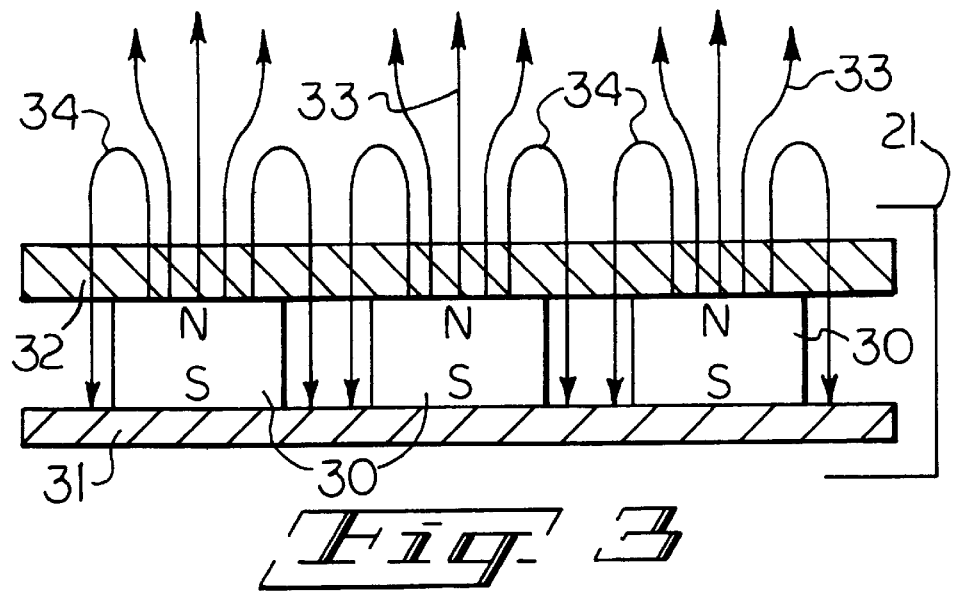
FIG. 3 is another view of the electrode of FIG. 2.

It is a key feature of the present invention that each magnetic pole of each magnet in an electrode of the present invention produces a magnetic field with the opposite magnetic pole on the same magnet. This is depicted in FIG. 3, wherein the north pole of each magnet 30 forms a magnetic field 33 with the south pole of the same magnet. Each magnet 30 has a component 34 of the magnetic field 33 that is parallel to the electrode surface. Each magnet that forms a magnetic field with the opposite magnetic pole of the same magnet creates at least one closed loop E×B drift path.

Thus, magnets in electrodes of the present invention are configured such that each magnet creates its own closed loop E×B drift path(s). Preferably, this is done by aligning the magnets in electrodes of the present invention so that like magnetic poles are all facing in substantially the same direction, as shown in FIG. 3. By substantially the same direction, it is meant that like magnetic poles of all magnets are facing in the same direction relative to the surface of the electrode. Thus, although the electrode depicted in FIG. 3 is a planar electrode, it is envisioned that the electrode could be curved. For example, the electrode could be formed into a cylindrical shape with all north poles facing outward from the center of the cylinder.

When magnets in electrodes of the present invention are aligned so that their like magnetic poles are facing in substantially the same direction, the magnets can be positioned in close proximity of each other without having any of the magnets forming magnetic fields with any of the magnets placed near it. Thus, even when magnets are placed in close proximity to each other, each magnet still creates its own closed loop E×B drift path(s).

Because the magnets can be placed in close proximity with each other while each magnet maintains its own closed loop E×B drift path(s), electrodes of the present invention enjoy the benefit of having more closed loop E×B drift paths per electrode surface area. This increased number of closed loop drift paths per electrode surface area results in a more uniform plasma than plasmas produced using magnetic confined type electrodes of the prior art. It has also been visually observed that plasmas generated using electrodes of the present invention diffuse farther away from the electrode surface in the space between the electrodes than plasmas generated using electrodes of the prior art. Although it is not definitively known exactly why this behavior is observed, it is believed that a portion of each magnetic field is repelled away from the electrode surface by the like magnetic poles on the electrode surface. It is also believed that these portions of magnetic field result in a portion of the plasma to be produced further from the electrode surface than would be possible if the magnets were positioned with alternating polarity.

Figure 4:
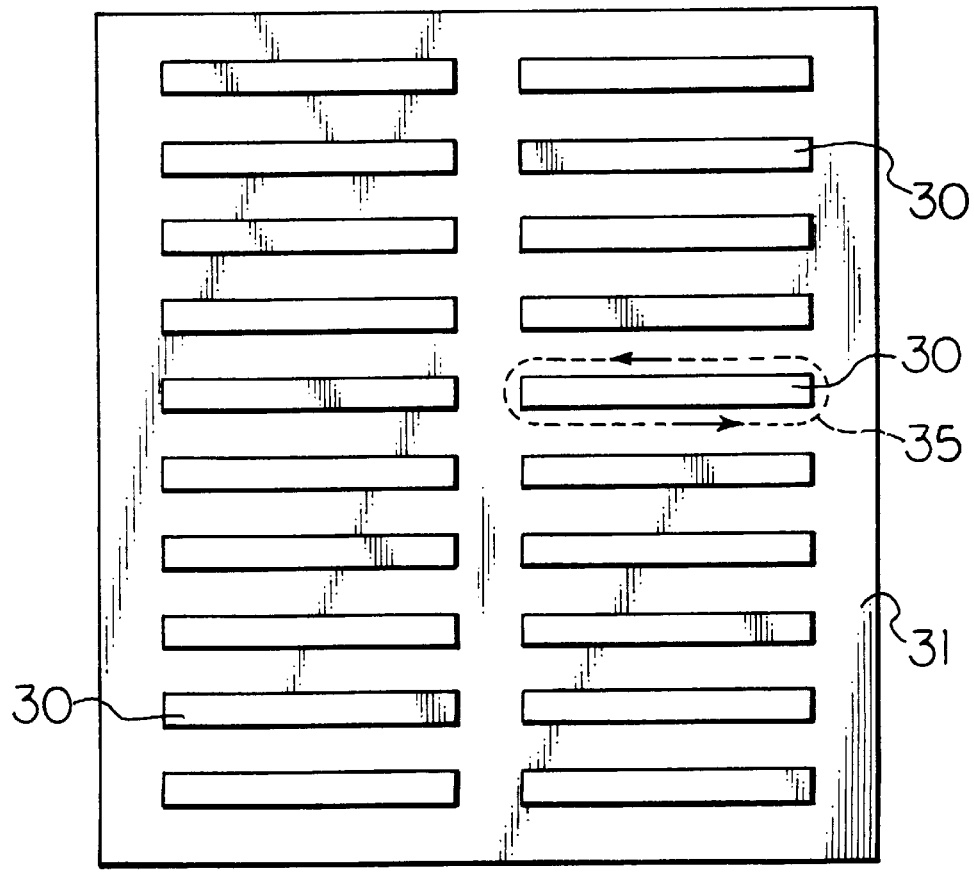
FIG. 4 is a view of another electrode of the present invention.

Large electrodes of the present invention can be created by configuring large numbers of magnets, all having like magnetic poles facing in substantially the same direction. For example, FIG. 4 shows a planar electrode of the present invention containing two rows of magnets 30. Even larger electrodes can be produced by increasing the number of magnets in each row or by adding more rows of magnets.

Figure 5:
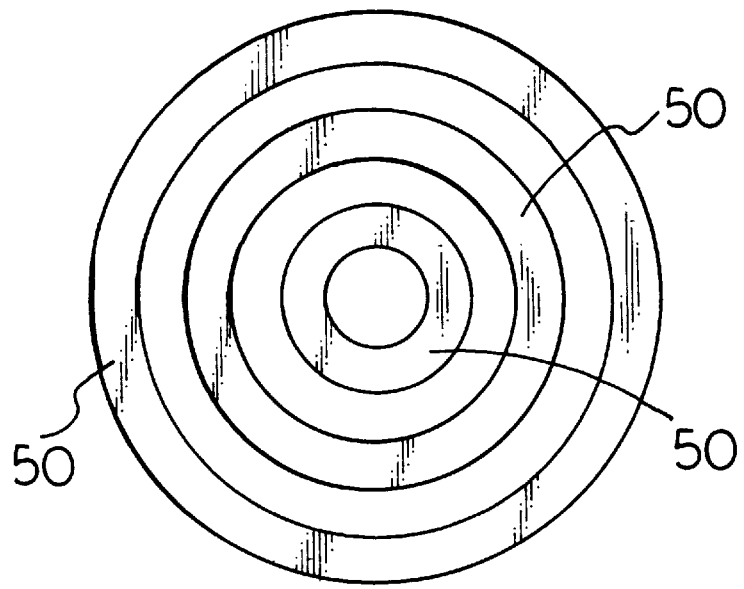
FIG. 5 is a view of an alignment of magnets useful in an electrode of the present invention.
Figure 6:
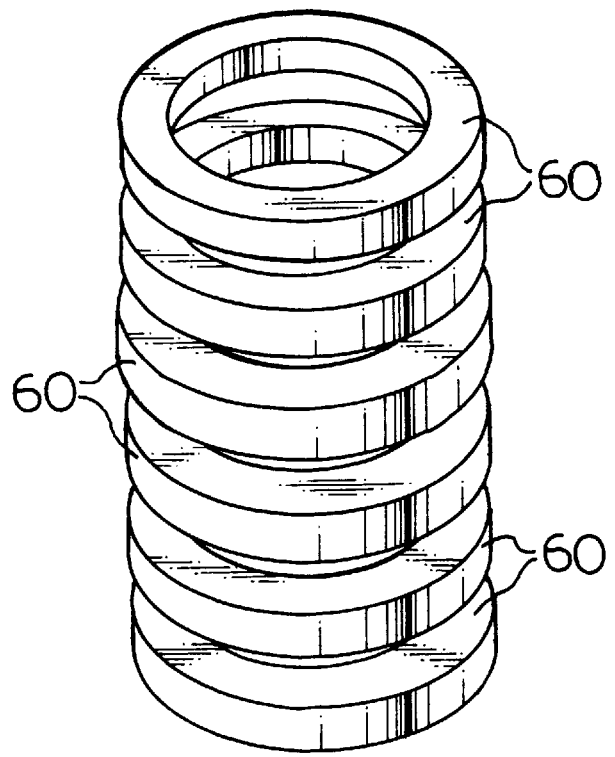
FIG. 6 is a view of another alignment of magnets useful in an electrode of the present invention.

When bar magnets are utilized according to the teachings of the present invention as shown in FIG. 4, each magnet 30 creates a single closed loop E×B drift path 35. However, if circular magnets are utilized as shown in FIG. 5 or FIG. 6, each magnet creates two separate closed loop E×B drift paths. For example, FIG. 5 shows concentric rings of magnets 50 wherein the visible surface of each magnet (i.e., the flat surface facing the reader) has the same polarity. Each magnet in FIG. 5 generates two separate closed loop E×B drift paths. FIG. 6 shows circular magnets 60 all having the same radius aligned in a cylindrical shape. If the curved surface of each magnet 60 that faces outward from the center of the cylinder has the same polarity then each magnet 60 will generate two separate closed loop E×B drift paths.

The magnets utilized in electrodes of the present invention should not be positioned so close to each other so as to prevent one magnetic pole of the magnet from producing a magnetic field with the opposite magnetic pole of the same magnet. If the magnets are positioned too close to each other they may behave as a single magnet. There is no critical limitation as to how far apart the magnets may be positioned. However, as magnets are positioned farther apart, their corresponding closed loop E×B drift paths are farther apart and the resulting plasma produced will be less uniform than a plasma produced when the magnets are positioned closer together. A distance between magnets adequate for a given application can be determined without undue experimentation.

Wider bar magnets will produce a larger gap in the center of the corresponding closed loop E×B drift path. Larger gaps in the closed loop E×B drift paths also result in the production of a less uniform plasma. Thus, it is generally more desirable to utilize relatively narrow bar magnets. However, if the magnets utilized in electrodes of the present invention are too narrow then the closed loop E×B drift path also will be too narrow, making the plasma increasingly difficult to initiate. A magnet width adequate for a given application can be determined without undue experimentation.

EXAMPLES

Deposition of $SiO_xC_yH_z$, of was carried out according to the teachings of U.S. Pat. No. 5,433,786 except that the deposition was carried out in a PECVD stainless steel box equipped with a pair of electrodes of the present invention. Each electrode was a planar electrode having dimensions of 30 inches by 120 inches. Each electrode was constructed of 5 segments, each segment having dimensions of 30 inches by 24 inches. Each segment was constructed by arranging 2 rows of 12 bar magnets on a backing plate made of a 1/16 inch soft iron sheet. The magnets were arranged in the manner depicted in FIG. 4. Each of the magnets was 8.5 inches long, 0.75 inches wide, and 0.5 inches high. The magnets in each row were placed 1.5 inches apart Each magnet had a surface field of 1 kilogauss. The magnets were obtained from Midwest Industries. On one electrode each magnet was placed such that the north pole of each magnet faced away from the backing plate and on the other electrode each magnet was placed such that the south pole of each magnet faced away from the backing plate. The magnets were covered with a 3/16 inch aluminum sheet (header plate) which became the surface of the electrode. The electrodes were placed in the PECVD chamber in parallel 9 inches apart so that the surface of one electrode (all north poles) faced the surface of the other electrode (all south poles). Utilizing these two electrodes, the PECVD device generated uniform plasma conditions over an area approximately 30 inches by 120 inches.

What is claimed is:

1. A plasma-generating device comprising two electrodes, at least one of said electrodes defining an electrode surface and containing three or more magnets, each magnet in the magnet-containing electrode having two opposite magnetic poles, all magnets in the magnet-containing electrode positioned such that like magnetic poles of said magnets are all facing in substantially the same direction, each magnetic pole of each magnet producing a magnetic field with the opposite magnetic pole on the same magnet; each magnetic field having a component parallel to said electrode surface.

2. A plasma-generating device according to claim 1, wherein each magnet creates a single closed loop E×B drift path parallel to the surface of the electrode.

3. A plasma-generating device according to claim 1, wherein each magnet creates two closed loop E×B drift paths parallel to the surface of the electrode.

4. A plasma-generating device comprising two electrodes, at least one electrode being a planar electrode and containing three or more magnets, each magnet in the planar, magnet-containing electrode having two opposite magnetic poles, all magnets in the planar, magnet-containing electrode positioned such that like magnetic poles of said magnets are in a single geometric plane parallel to the geometric plane of the planar electrode and the polarity of said magnets is perpendicular to the geometric plane of the planar electrode, each magnetic pole of each magnet producing a magnetic field with the opposite magnetic pole on the same magnet, each magnetic field having a component parallel to the geometric plane of the electrode.

5. A plasma-generating device according to claim 4, wherein each magnet creates a single closed loop E×B drift path parallel to the geometric plane of the planar electrode.

6. A plasma-generating device according to claim 4, wherein each magnet creates two closed loop E×B drift paths parallel to the geometric plane of the planar electrode.

7. A plasma-generating device comprising:
    a) two electrodes, at least one of said electrodes defining an electrode surface and containing three or more magnets, each magnet in the magnet-containing electrode having two opposite magnetic poles, all magnets in the magnet-containing electrode positioned such that like magnetic poles of said magnets are all facing in substantially the same direction, each magnetic pole of each magnet producing a magnetic field with the opposite magnetic pole in the same magnet, each magnetic field having a component parallel to the electrode surface, the magnets having sufficient strength to generate at least 100 gauss; and
    b) a means for injecting gaseous reactants through at least one electrode, said means directing substantially all of said reactants through the magnetic fields.

8. A plasma-generating device according to claim 7, wherein each magnet creates a single closed loop E×B drift path parallel to the surface of the electrode.

9. A plasma-generating device according to claim 7, wherein each magnet creates two closed loop E×B drift paths parallel to the surface of the electrode.

10. A method of providing an abrasion resistant coating onto the surface of a substrate employing plasma enhanced chemical vapor deposition of an organosilicone monomer gas in a plasma reaction zone and oxygen gas, comprising the steps of:
    a) plasma polymerizing the organosilicone monomer in the presence of excess oxygen employing a power density within the range of about $10^6$ to about $10^8$ J/Kg in the presence of the substrate; and
    b) conducting the oxygen and organosilicone monomer gases in a direction which is essentially perpendicular to the substrate surface and through a magnetic field of at least 100 gauss, which is contained essentially in a zone adjacent to the plasma zone and into the plasma reaction zone,
        wherein the magnetic field of at least 100 gauss is produced by an electrode, the electrode defining an electrode surface and containing three or more magnets, each magnet in the electrode having two opposite magnetic poles, all magnets in the electrode positioned such that like magnetic poles of said magnets are all facing in substantially the same direction, each magnetic pole of each magnet producing a magnetic field with the opposite magnetic pole on the same magnet, each magnetic field having a component parallel to the electrode surface.

11. A plasma-generating device according to claim 10, wherein each magnet creates a single closed loop E×B drift path parallel to the surface of the electrode.

12. A plasma-generating device according to claim 10, wherein each magnet creates two closed loop E×B drift paths parallel to the surface of the electrode.

* * * * *